(12) United States Patent
Li et al.

(10) Patent No.: US 12,232,359 B2
(45) Date of Patent: Feb. 18, 2025

(54) DISPLAY PANEL AND DISPLAY DEVICE WITH ANGLE ADJUSTMENT OF LIGHT-EMITTING ELEMENT

(71) Applicant: WUHAN TIANMA MICRO-ELECTRONICS CO., LTD., Wuhan (CN)

(72) Inventors: Qianglong Li, Wuhan (CN); Xu Zhang, Wuhan (CN); Jiancheng Zhao, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 601 days.

(21) Appl. No.: 17/480,352

(22) Filed: Sep. 21, 2021

(65) Prior Publication Data
US 2022/0005919 A1 Jan. 6, 2022

(30) Foreign Application Priority Data

Mar. 10, 2021 (CN) .......................... 202110262381.0

(51) Int. Cl.
*H10K 59/00* (2023.01)
*G09F 9/30* (2006.01)
(Continued)

(52) U.S. Cl.
CPC ............. *H10K 59/00* (2023.02); *G09F 9/301* (2013.01); *H10K 59/131* (2023.02);
(Continued)

(58) Field of Classification Search
CPC ............ G09F 9/33; G09F 9/301; G09F 9/335; H10K 59/1213; H10K 59/123; H10K 59/131; H10K 2102/311; H10K 2102/00; H10K 59/00; H10K 59/70; H10K 59/875; H10K 50/85; H10K 50/86; H10K 59/8791;
(Continued)

(56) References Cited

U.S. PATENT DOCUMENTS

| | | | |
|---|---|---|---|
| 2014/0015402 A1* | 1/2014 | Ahn ....................... | H10N 39/00 313/511 |
| 2017/0092404 A1* | 3/2017 | Sai ........................... | G09G 3/03 |

(Continued)

FOREIGN PATENT DOCUMENTS

| | | |
|---|---|---|
| CN | 110098241 A | 8/2019 |
| CN | 111341935 A | 6/2020 |
| CN | 111987128 A | 11/2020 |

*Primary Examiner* — Ratisha Mehta
*Assistant Examiner* — Brad A Knudson
(74) *Attorney, Agent, or Firm* — KILPATRICK TOWNSEND & STOCKTON LLP

(57) ABSTRACT

Provided are a display panel and a display device. The display panel includes a substrate, a light-emitting element located on a side of the substrate, and a deformation module located between the substrate and the light-emitting element and including at least one deformation element. In a direction perpendicular to a plane where the substrate is located, the at least one deformation element in the deformation module overlaps the light-emitting element. Provided are a display panel and a display device to change a light-emitting angle of a light-emitting element, so that users can obtain a better view angle and the display effect can be improved.

17 Claims, 14 Drawing Sheets

(51) Int. Cl.
   *H10K 59/131*   (2023.01)
   *H10N 39/00*    (2023.01)
   H10K 59/80      (2023.01)
   H10K 102/00     (2023.01)
   H10N 30/20      (2023.01)
   H10N 30/85      (2023.01)
   H10N 30/853     (2023.01)

(52) U.S. Cl.
   CPC ........... *H10N 39/00* (2023.02); *H10K 59/875* (2023.02); *H10K 59/8791* (2023.02); *H10K 2102/311* (2023.02); *H10N 30/20* (2023.02); *H10N 30/85* (2023.02); *H10N 30/8554* (2023.02)

(58) Field of Classification Search
   CPC .... H10N 39/00; H10N 30/20; H10N 30/8554; H10N 30/85; H01L 25/04; H01L 25/065; H01L 25/0652; H01L 25/0655; H01L 25/0657; H01L 25/16; H01L 25/162; H01L 25/165; H01L 25/167; H01L 25/18
   See application file for complete search history.

(56) References Cited

U.S. PATENT DOCUMENTS

| | | | | |
|---|---|---|---|---|
| 2017/0123281 A1* | 5/2017 | Lee | ......................... | H10N 39/00 |
| 2022/0310920 A1* | 9/2022 | Sun | ......................... | H10K 50/11 |

* cited by examiner

DISPLAY PANEL AND DISPLAY DEVICE WITH ANGLE ADJUSTMENT OF LIGHT-EMITTING ELEMENT

CROSS-REFERENCE TO RELATED APPLICATION(S)

This application claims priority to Chinese Patent Application No. 202110262381.0, titled "DISPLAY PANEL AND DISPLAY DEVICE" filed Mar. 10, 2021, the disclosure of which is incorporated herein by reference in its entirety.

FIELD

The present disclosure relates to the field of display technologies, and in particular, to a display panel and a display device.

BACKGROUND

With the development of communication technology and social media, there is an increasing demand for full screens. Currently, common full screens are curved display screens, with flexible display panels with an edge portion usually being bent to make the edge portion of the flexible display panel curved, thus realizing full screens. Human eyes can obtain a maximum brightness when observing the curved display screen from the front, but when observing the curved display screen from the sides, the display brightness drops sharply with poor view angles and insufficient stereoscopic effect, thus affecting the display effect.

SUMMARY

The present disclosure provides a display panel and a display device to change a light-emitting angle of a light-emitting element, so that users can obtain a better view angle and the display effect can be improved.

In one embodiment of the present disclosure provide a display panel, includes
 a substrate;
 a light-emitting element located on a side of the substrate;
 a deformation module located between the substrate and the light-emitting element;
where the deformation module includes at least one deformation element, and in a direction perpendicular to a plane where the substrate is located, the at least one deformation element in the deformation module overlaps the light-emitting element.

In another embodiment of the present disclosure provide a display device including the display panel described in the other embodiments.

Embodiments of the present disclosure provide a display panel. The display panel includes a deformation module, and the deformation module is located between a substrate and a light-emitting element. At least one deformation element in the deformation module overlaps the light-emitting element, so that in a case where the deformation module deforms, the light-emitting direction of the light-emitting element can be changed so that the light-emitting direction of the light-emitting element is at an acute angle to the plane of the substrate, which allows that when observing from a side of the curved display screen, users can obtain a better view angle, improving the display effect.

DETAILED DESCRIPTION OF THE EMBODIMENTS

The present disclosure is to be further described in detail with reference to the accompanying drawings and embodiments. It can be understood that, the embodiments described here are only used to explain the present disclosure, rather than to limit the present disclosure. In addition, it should be noted that, for the convenience of description, the drawings only show part of rather than all of the structure related to the present disclosure.

Figure 1:
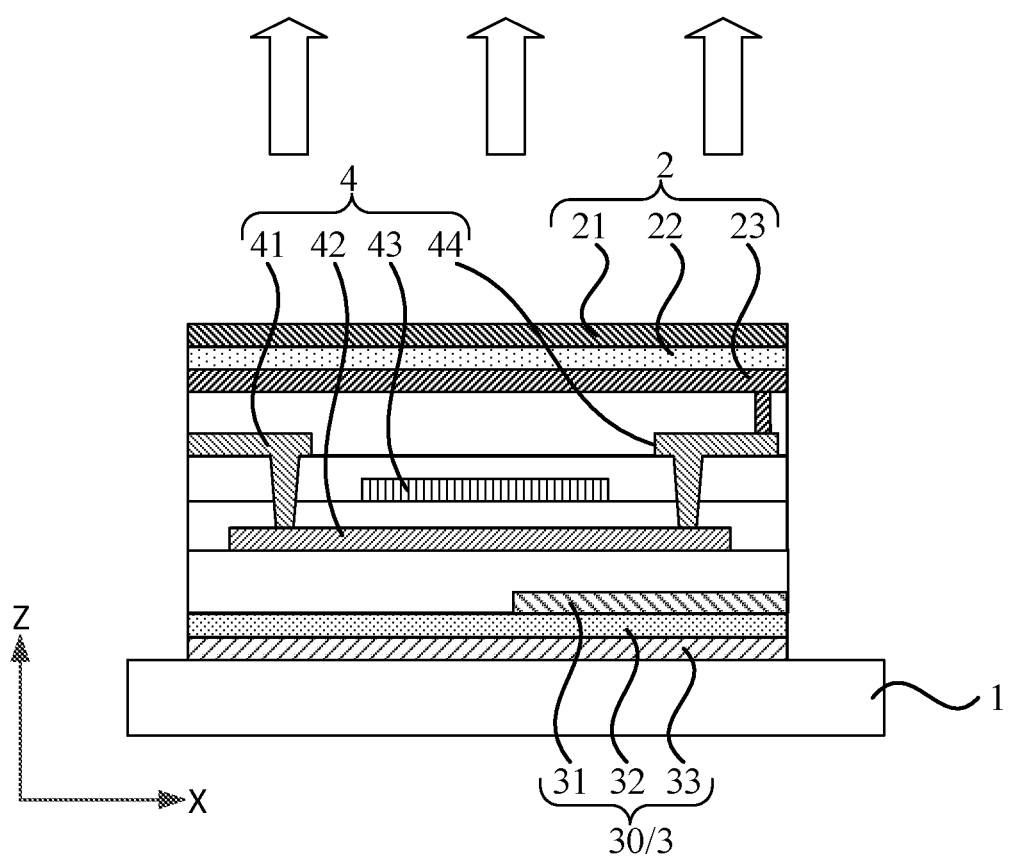
FIG. 1 is a schematic cross-sectional view of a display panel provided by an embodiment of the present disclosure.
Figure 2:
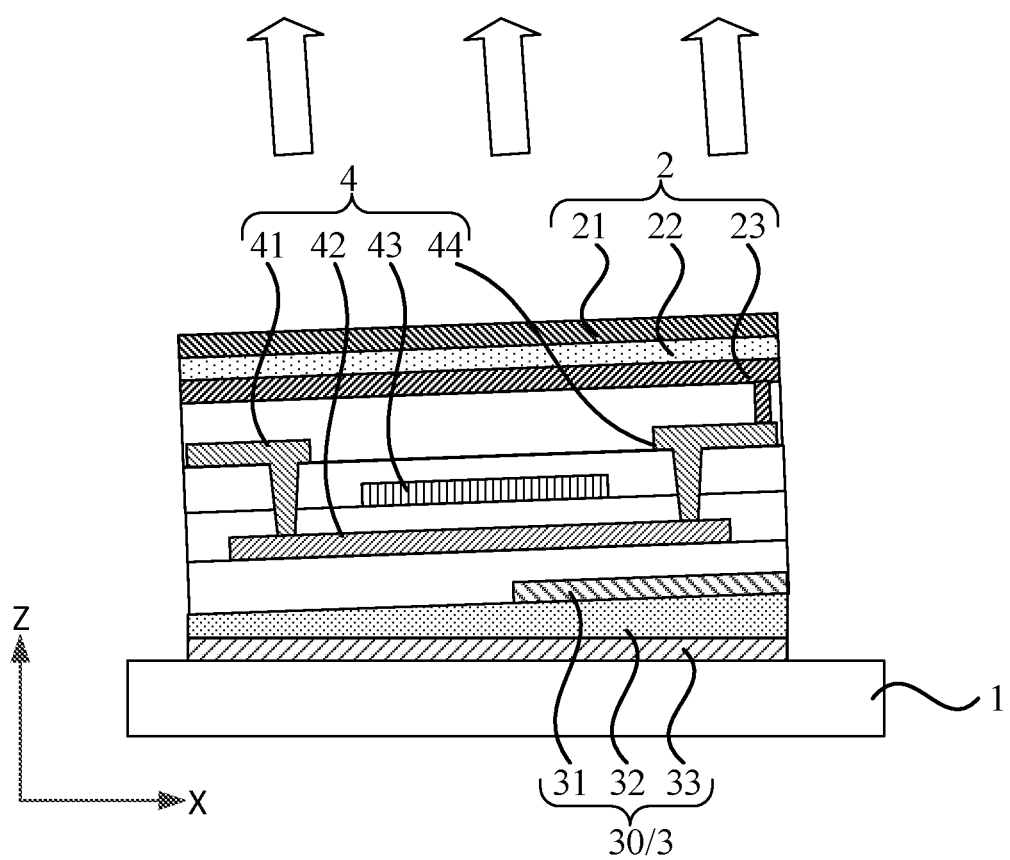
FIG. 2 is a schematic cross-sectional view of the deformation module in the display panel shown in FIG. 1 after deforming.

FIG. 1 is a schematic cross-sectional view of a display panel provided by an embodiment of the present disclosure. FIG. 2 is a schematic cross-sectional view of a deformation module in the display panel shown in FIG. 1 after deforming. With reference to FIG. 1 and FIG. 2, the display panel includes a substrate 1, a light-emitting element 2, and a deformation module 3. The substrate 1 may be a flexible substrate. For example, a flexible material such as polyimide may be used to form the substrate 1. The light-emitting element 2 may be a light-emitting pixel in a display panel. In an embodiment, the light-emitting element 2 may be made of an organic light-emitting material or an inorganic light-emitting material. The light-emitting element 2 is located on a side of the substrate 1. The deformation module 3 is located between the substrate 1 and the light-emitting element 2. The deformation module 3 includes at least one deformation element 30 (as shown in FIG. 1, a case that the deformation module 3 includes one deformation element 30 is taken as an example for illustration, but the present disclosure is not limited thereto). In a direction perpendicular to a plane where the substrate 1 is located, the at least one deformation element 30 in the deformation module 3 overlaps the light-emitting element 2.

In one embodiment, with reference to FIG. 1, the deformation module 3 does not deform, and the light-emitting element 2 emits light in a direction perpendicular to the plane where the substrate 1 is located. Human eyes can obtain a maximum brightness when viewing the light-emitting element 2 of the display panel from the front. In a case where the display panel is bent, the deformation module 3 and the light-emitting element 2 on a side of the deformation module 3 farther away from the substrate 1 are located on the side of the curved display screen, the display brightness from the side sharply drops and the view angle is poor. With reference to FIG. 2, the deformation module 3 is controlled to deform, a light-emitting direction of the light-emitting element 2 is no longer perpendicular to the plane where the substrate 1 is located, and the light-emitting direction of the light-emitting element 2 is at an acute angle to the plane where the substrate 1 is located, so that the deformation module 3 changes the light-emitting angle of the light-emitting element 2, and when observing from a side of the curved display screen, users can obtain a better view angle, improving the display effect.

An embodiment of the present disclosure provides a display panel. The display panel includes a deformation module 3 located between the substrate 1 and the light-emitting element 2. At least one deformation element 30 in the deformation module 3 overlaps the light-emitting element 2, so that in a case where the deformation module 3 deforms, the light-emitting direction of the light-emitting element 2 can be changed, the light-emitting direction of the light-emitting element 2 is at an acute angle to the plane where the substrate 1 is located, so that when observing from the side of the curved display screen, users can obtain a better view angle, thus the display effect can be improved.

In an embodiment, with reference to FIGS. 1 and 2, the display panel further includes a pixel driving circuit 4, the pixel driving circuit 4 is located between the at least one deformation element 30 and the light-emitting element 2, and the pixel driving circuit 4 is electrically connected to the light-emitting element 2. In the embodiments of the present disclosure, the deformation element 30 is located between the substrate 1 and the pixel driving circuit 4, and in a case where the deformation module 3 deforms, both the driving pixel driving circuit 4 and the light emitting element 2 tilt, thus changing a light-emitting angle of the light-emitting element 2.

In one embodiment, with reference to FIGS. 1 and 2, the pixel driving circuit 4 includes a thin film transistor. The thin film transistor may include a gate 43, a source 41, a drain 44, and a semiconductor layer 42. The gate 43 is located on a side of the semiconductor layer 42 farther away from the substrate 1. That is, the thin film transistor may be a top gate thin film transistor. In other embodiments, the thin film transistor may also be a bottom gate thin film transistor. The drain 44 of the thin film transistor is electrically connected to the light-emitting element 2. It can be understood that, the pixel driving circuit 4 may also include elements such as a capacitor to drive the light-emitting element 2 electrically connected to the capacitor to emit light.

Figure 3:
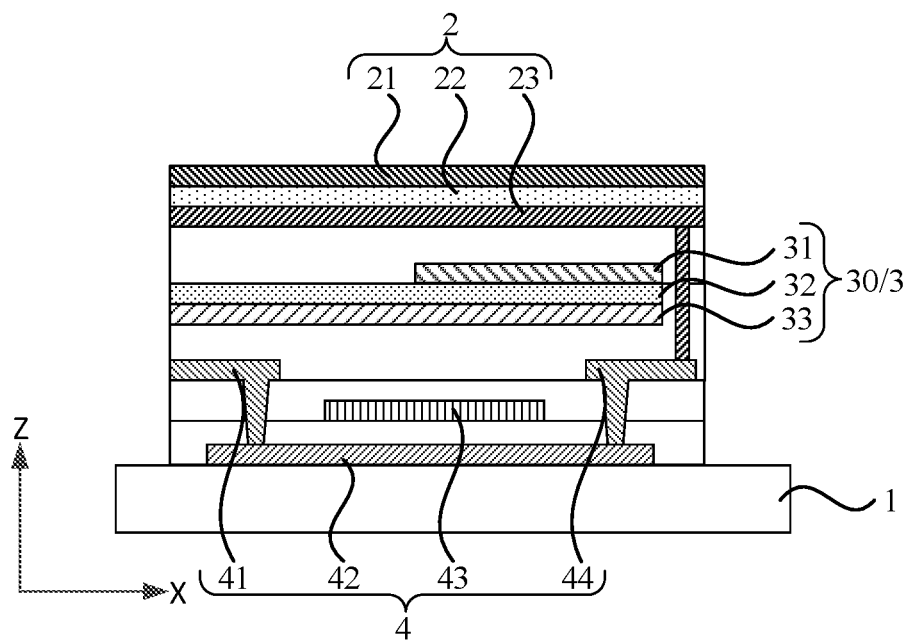
FIG. 3 is a schematic cross-sectional view of a display panel provided by another embodiment of the present disclosure.

FIG. 3 is a schematic cross-sectional view of a display panel provided by another embodiment of the present disclosure. With reference to FIG. 3, the display panel further includes a pixel driving circuit 4. The pixel driving circuit 4 is located between the substrate 1 and the at least one deformation element 30, and is electrically connected to the light-emitting element 2. In the embodiments of the present disclosure, the at least one deformation element 30 is located between the pixel driving circuit 4 and the light-emitting element 2; in a case where the deformation module 3 deforms, the pixel driving circuit 4 does not tilt, but the light-emitting element 2 is driven to tilt, changing the light-emitting angle of the light-emitting element 2 and improving working stability of the pixel driving circuit 4.

Figure 4:
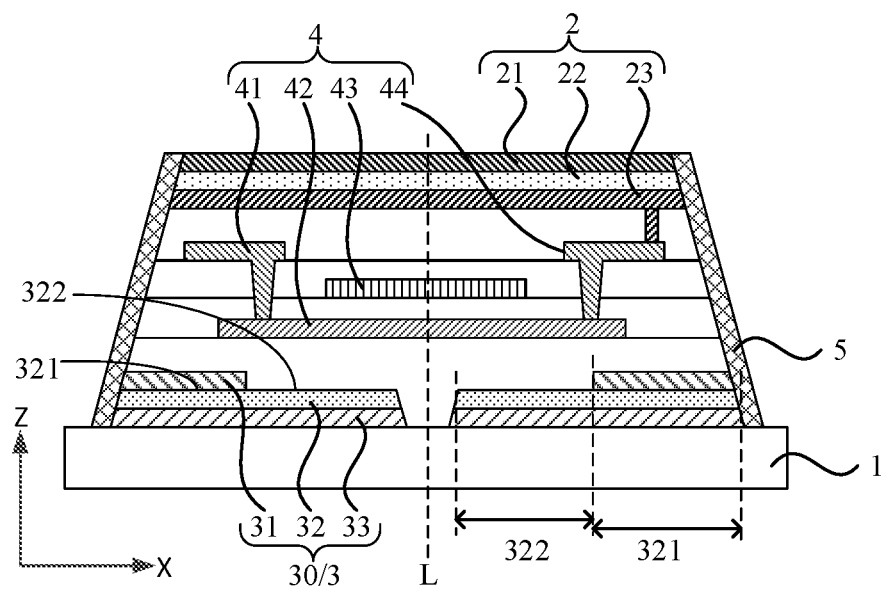
FIG. 4 is a schematic cross-sectional view of a display panel provided by another embodiment of the present disclosure.

FIG. 4 is a schematic cross-sectional view of a display panel provided by another embodiment of the present disclosure. With reference to FIG. 4, a cross section of the light-emitting element 2 and the deformation module 3 as a whole is in a trapezoidal structure perpendicular to the plane where the substrate 1 is located. As shown in FIG. 4, the display panel is taken perpendicular to the plane of the substrate 1 in the first direction X. In an obtained cross-sectional view of the display panel, the light-emitting element 2 and the deformation module 3 form a trapezoidal structure as a whole. In other embodiments, the display panel is taken perpendicular to the plane of the substrate 1 in the second direction Y (with reference to subsequent FIG. 6 or FIG. 9). In the obtained cross-sectional view of the display panel, the light-emitting element 2 and the deformation module 3 may also form a trapezoidal structure as a whole. The light-emitting element 2 and the deformation module 3 are in a trapezoidal structure as a whole, and in the direction farther away from the substrate 1, the trapezoidal structure formed by the light-emitting element 2 and the deformation module 3 changes from wide to narrow. In a case where the deformation module 3 deforms and the light-emitting element 2 tilts, the deformation module 3 and the light-emitting element 2 tilt at a same angle or at a similar angle. As the light-emitting element 2 is located on the side of the deformation module 3 farther away from the substrate 1, and a vertical distance from the light-emitting element 2 to the substrate 1 is greater than a vertical distance from the deformation module 3 to the substrate 1, thus a horizontal moving distance of the light-emitting element 2 that is farther away from the substrate 1 is larger than a horizontal moving distance of the deformation module 3 that is closer to the substrate 1, and the light-emitting element 2 and the deformation module 3 form a trapezoidal structure as a whole, which can provide sufficient space for the deformation of the deformation module 3.

In one embodiment, the display panel may further include data lines and scan lines. The plurality of scan lines extend in the first direction X and are arranged in the second direction Y, and the plurality of data lines extend in the second direction Y and are arranged in the first direction X. The gate 43 of the thin film transistor may be electrically connected to a scan line, and the source 41 of the thin film transistor may be electrically connected to a data line. In a case where the scan line applies a scan signal to the gate 43, the thin film transistor is controlled to be turned on, and data signal from the data line is finally applied to the light-emitting element 2 to control the light-emitting brightness of the light-emitting element 2.

In one embodiment, the light-emitting element 2 and the deformation module 3 as a whole is in a shape of a truncated cone, and a cross section of the truncated cone perpendicular to the plane where the substrate 1 is located forms a trapezoidal structure. In another embodiment, the light-emitting element 2 and the deformation module 3 as a whole is in a shape of a truncated pyramid, such as a quadrangular pyramid, and a cross section of the truncated pyramid perpendicular to the plane where the substrate 1 is located forms a trapezoidal structure. It should be noted that, the trapezoidal structure described in the embodiment of the present disclosure may also include other film layers and structures between the light-emitting element 2 and the deformation module 3, e.g., it may also include the pixel driving circuit 4 or some insulating layers.

In an embodiment, with reference to FIG. 4, the display panel further includes an isolation layer 5, which is located on a sidewall of the trapezoidal structure. In the embodiments of the present disclosure, the sidewall of the trapezoidal structure is further provided with the isolation layer 5, which is parallel to the plane where the substrate 1 is located. The isolation layer 5 may surround the light-emitting element 2 and the deformation module 3 for a circle, thus the isolation layer 5 can be used as a protective layer for the light-emitting element 2 and the deformation module 3, and as an isolation film layer for separating deformation modules 3.

In one embodiment, with reference to FIG. 4, the isolation layer 5 is in contact with the substrate 1, and the substrate 1 blocks one end of the isolation layer 5. The substrate 1 and the isolation layer 5 form an accommodating cavity, and the light-emitting element 2 and the deformation module 3 are located in the accommodating cavity.

In an embodiment, with reference to FIGS. 1 to 4, the deformation element 30 includes a deformation anode 31, a deformation layer 32 and a deformation cathode 33. The deformation layer 32 is located between the deformation anode 31 and the deformation cathode 33. The deformation layer 32 can exhibit different deformation magnitudes according to changes of electric field intensity between the deformation anode 31 and the deformation cathode 33, controlling the light-emitting angle of the light-emitting element 2.

In one embodiment, the deformation layer 32 generates strain under an action of an electric field, and the strain is proportional to a square of the electric field intensity. Such strain, in one embodiment, is caused by induced polarization, and a direction of the strain is not directly related to the direction of the electric field. The deformation layer 32 may be made of lead lanthanum zirconate titanate (PLZT) ceramic. The functional features of the PLZT ceramic material are in a close relation to its composition and preparation method; however, amelioration to the composition and the preparation method has some limitations to optimization of performance and optimization of structure. As a material for practical applications, it is necessary to consider a variety of characteristics, such as bias voltage, resistivity, and dielectric loss.

In an embodiment, with reference to FIG. 4, an area of the surface of the deformation layer 32 farther away from the substrate 1 is smaller than an area of the deformation layer 32 closer to the substrate 1. In the embodiments of the present disclosure, the area of the surface of the deformation layer 32 farther away from the substrate 1 is relatively small, while the area of the surface of the deformation layer 32 closer to the substrate 1 is relatively large. Taking the substrate 1 as a reference, the deformation layer 32 has a structure with a wider bottom and a narrower top, providing sufficient space for its own deformation.

In an embodiment, with reference to FIG. 4, the deformation layer 32 includes a first region 321 and a second region 322. The second region 322 is located on a side of the first region 321 closer to a center L of the light-emitting element 2, and the deformation anode 31 is located in the first region 321. The center L of the light-emitting element 2 refers to a center of gravity of the light-emitting element 2. In the embodiments of the present disclosure, the deformation element 30 includes a deformation anode 31. The deformation anode 31 is only disposed in the first region 321 of the deformation layer 32, and is not disposed in the second region 322 of the deformation layer 32. That is, the deformation anode 31 is disposed only in a partial region of the deformation layer 32, so that the deformation layer 32 receives different electric field intensities from the first region 321 and the second region 322, to make the surface of the deformation anode 31 on the side farther away from the substrate 1 tilt, thus changing the emission angle of the light-emitting element 2.

In one embodiment, with reference to FIG. 4, the deformation module 3 includes at least two deformation elements 30, and, the two deformation elements 30 are respectively located on both sides of the center L of the light-emitting element 2 in the first direction X. In other embodiments, the two deformation elements 30 may also respectively located on both sides of the center L of the light-emitting element 2 in the second direction Y (with reference to the subsequent FIG. 6 or FIG. 9).

Figure 5:
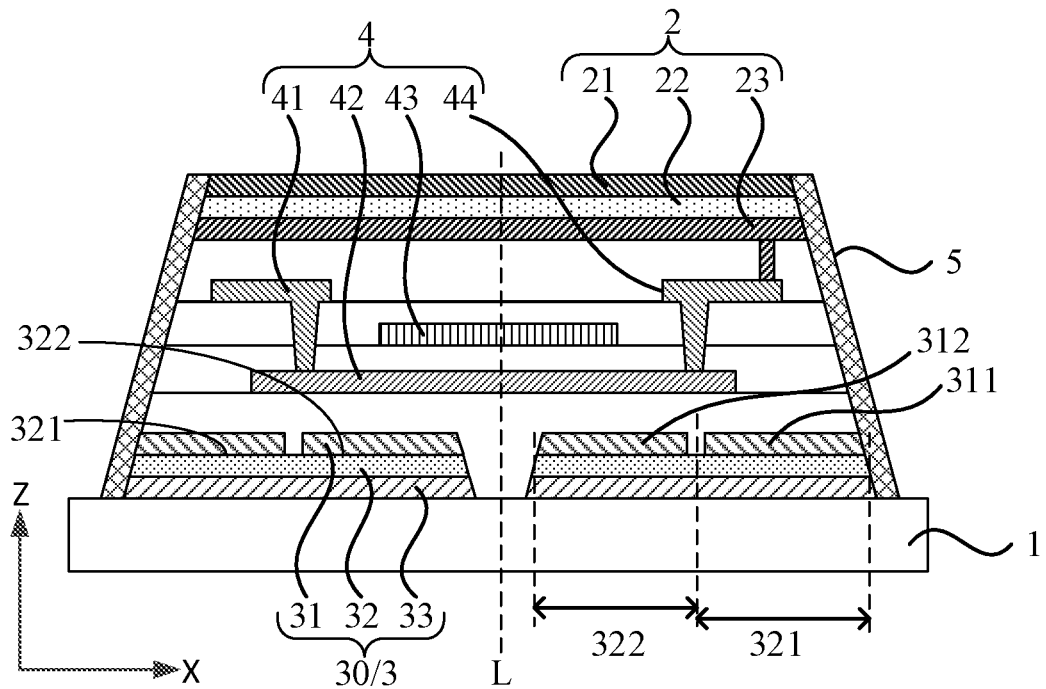
FIG. 5 is a schematic cross-sectional view of a display panel provided by another embodiment of the present disclosure.

FIG. 5 is a schematic cross-sectional view of a display panel provided by another embodiment of the present disclosure. With reference to FIG. 5, the deformation layer 32 includes a first region 321 and a second region 322. The second region 322 is located at a side of the first region 321 closer to the center L of the light-emitting element 2. The deformation anode 31 includes a first deformation anode 311 and a second deformation anode 312 that are electrically insulated from each other. The first deformation anode 311 is located in the first region 321, and the second deformation anode 312 is located in the second region 322. In the embodiments of the present disclosure, by that the deformation element 30 includes the first deformation anode 311 and the second deformation anode 312, that the first deformation anode 311 is disposed in the first region 321 of the deformation layer 32, and that the second deformation anode 312 is disposed in the second region 322 of the deformation layer 32, the deformation layer 32 receives the electric field formed between the first deformation anode 311 and the deformation cathode 33 in the first region 321, and the deformation layer 32 receives the electric field formed between the second deformation anode 312 and the deformation cathode 33 in the second region 322, so that different electric field intensities can be received in the first region 321 and the second region 322, to make the surface of the deformation anode 31 on the side farther away from the substrate 1 tilt, changing the emission angle of the light-emitting element 2.

Figure 6:
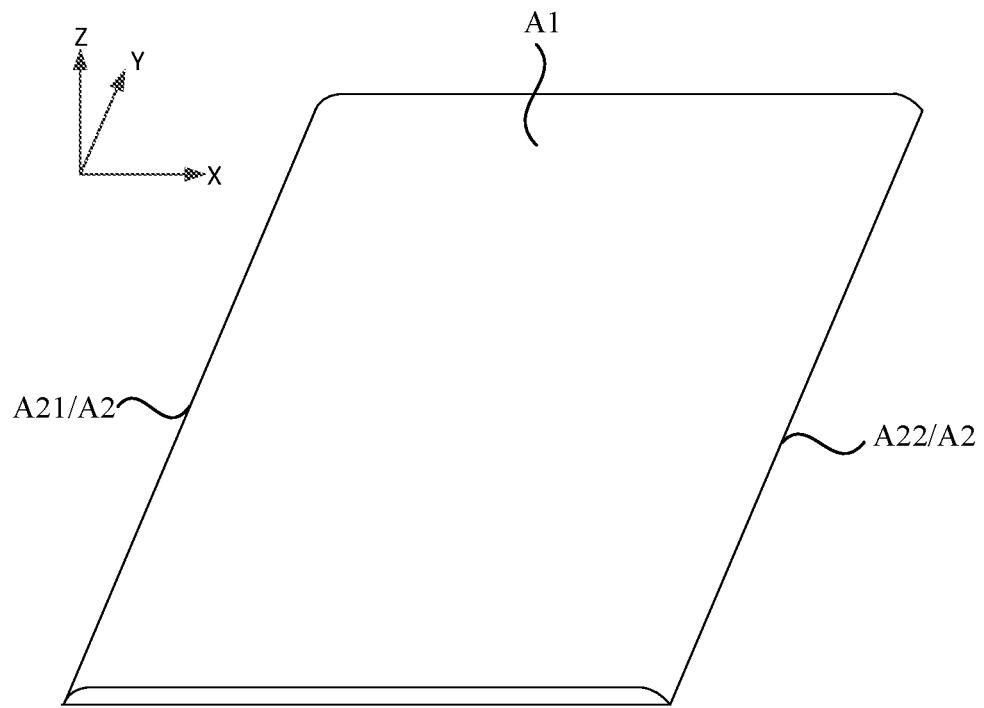
FIG. 6 is a schematic stereoscopic view of a display panel provided by an embodiment of the present disclosure.
Figure 7:
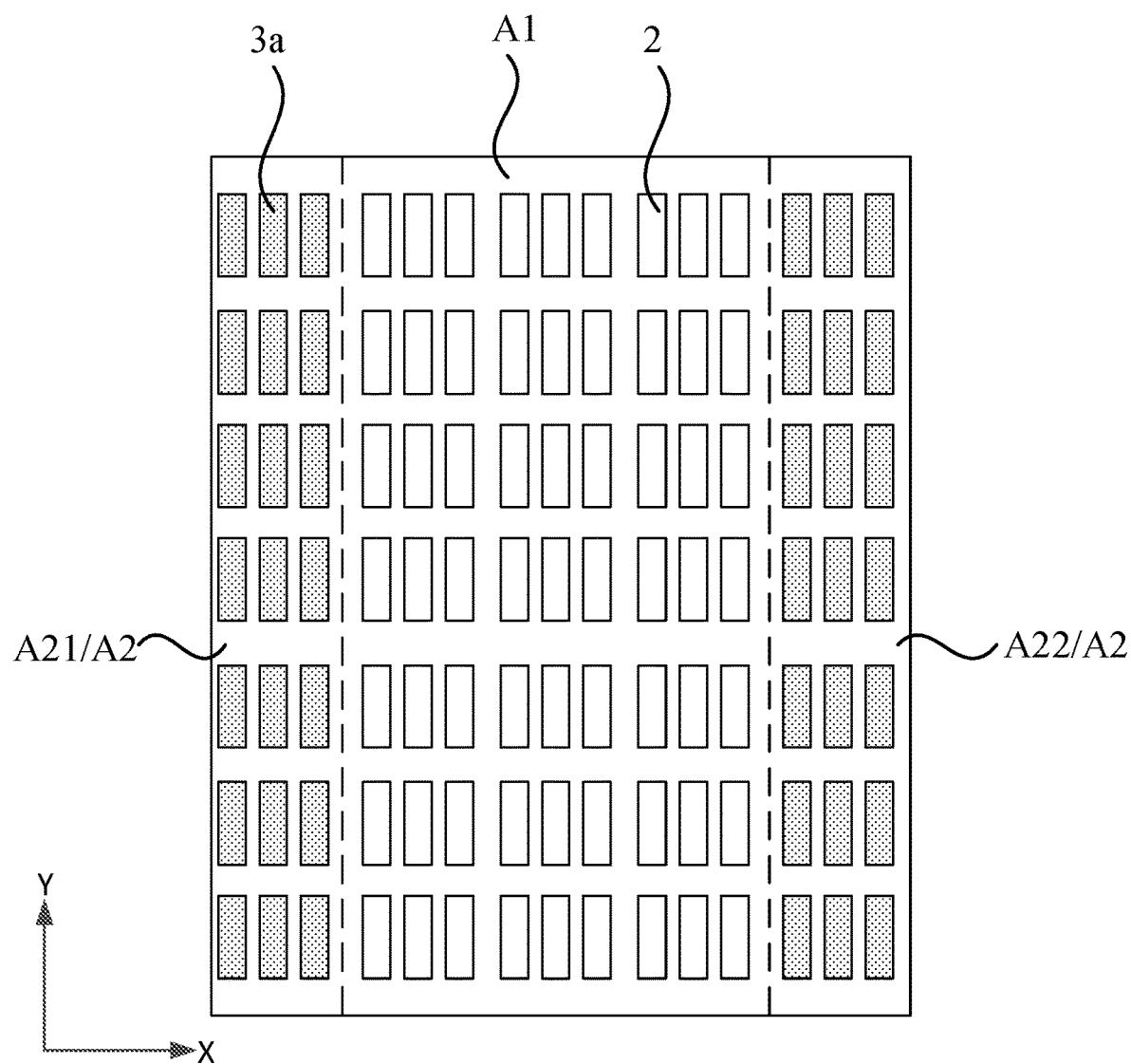
FIG. 7 is a schematic top view of the display panel of FIG. 6.
Figure 8:
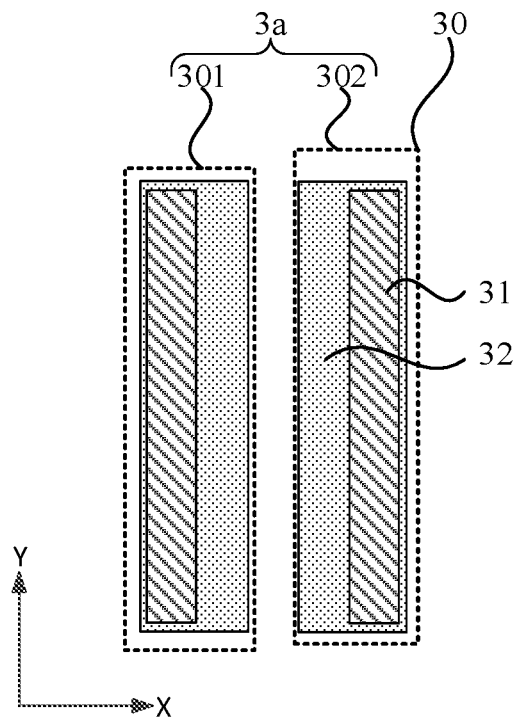
FIG. 8 is a schematic top view of a first deformation module provided by an embodiment of the present disclosure.

FIG. 6 is a schematic stereoscopic view of a display panel provided by an embodiment of the present disclosure, FIG. 7 is a schematic top view of the display panel shown in FIG. 6, FIG. 8 is a vertical schematic view of a first deformation module provided by an embodiment of the present disclosure, and with reference to FIGS. 6-8, the display panel includes a main display region A1 and peripheral display regions A2. The plurality of peripheral display regions A2 is bent toward a side opposite to the main display region A1. The main display region A1 and the plurality of peripheral display regions A2 are integrally formed. The main display region A1 and the peripheral display region A2 are different display regions of a same display panel. In a case where the display panel has been bent, the peripheral display regions A2 are bent toward a boundary between the peripheral display regions A2 and the main display region A1, so that the display panel forms a curved display screen with multiple side surfaces.

The plurality of peripheral display regions A2 include a first peripheral display region A21 and a second peripheral display region A22 that are disposed opposite to each other in the first direction X. The deformation module 3 includes a first deformation module 3a, and the first deformation module 3a includes two deformation elements 30. The two deformation elements 30 refer to a first deformation element 301 and a second deformation element 302 respectively. In a same first deformation module 3a, the first deformation element 301 and the second deformation element 302 are arranged in the first direction X. The first deformation module 3a is located in at least one of a first peripheral display region A21 and a second peripheral display region A22.

In the embodiments of the present disclosure, the display panel may be a double-curved screen, and the first peripheral display region A21 and the second peripheral display region A22 are respectively located on the left side surface pf the display panel and on the right side surface pf the display panel. In a case where the first deformation module 3a is disposed in at least one of the first peripheral display region A21 and the second peripheral display region A22, the light-emitting element 2 can be made to tilt in a X-Z plane by the deformations of the first deformation element 301 and the second deformation element 302 disposed in the first direction X, to change a light-emitting direction and a light-emitting angle of the light-emitting element 2 in the X-Z plane, to make the light transmission path incline upward, thus users can obtain a better view angle and the display effect can be improved.

In one embodiment, the first deformation module 3a includes a first deformation element 301 and a second deformation element 302. In a direction perpendicular to the plane where the substrate 1 is located, the first deformation module 3a and the light-emitting element 2 overlap in a one-to-one correspondence. Thus, the light-emitting angle of the light-emitting element 2 can be changed by the first deformation module 3a that overlaps the light-emitting element 2. In other embodiments, in the direction perpendicular to the plane where the substrate 1 is located, at least two first deformation modules 3a may also overlap a same light-emitting element 2.

Figure 9:
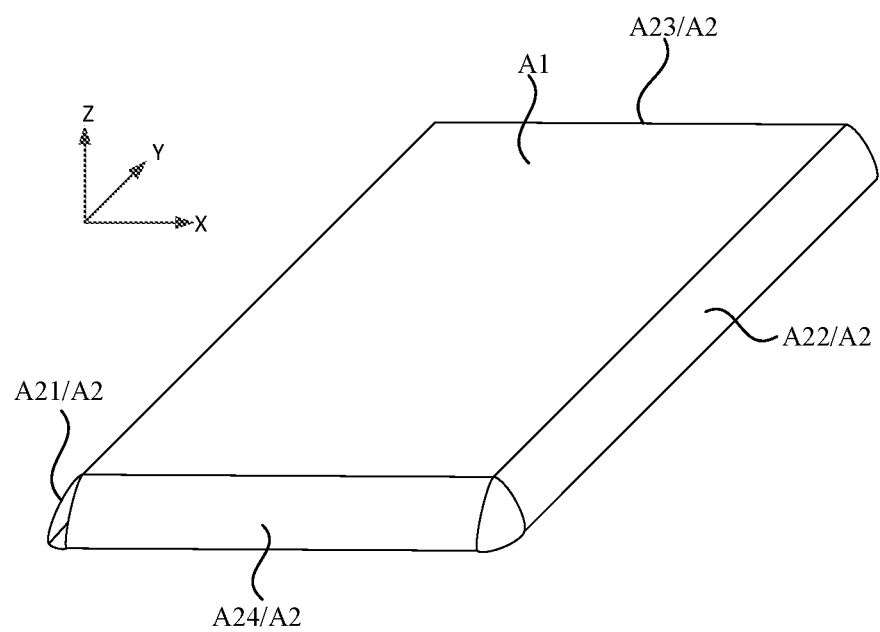
FIG. 9 is a schematic stereoscopic view of a display panel provided by another embodiment of the present disclosure.
Figure 10:
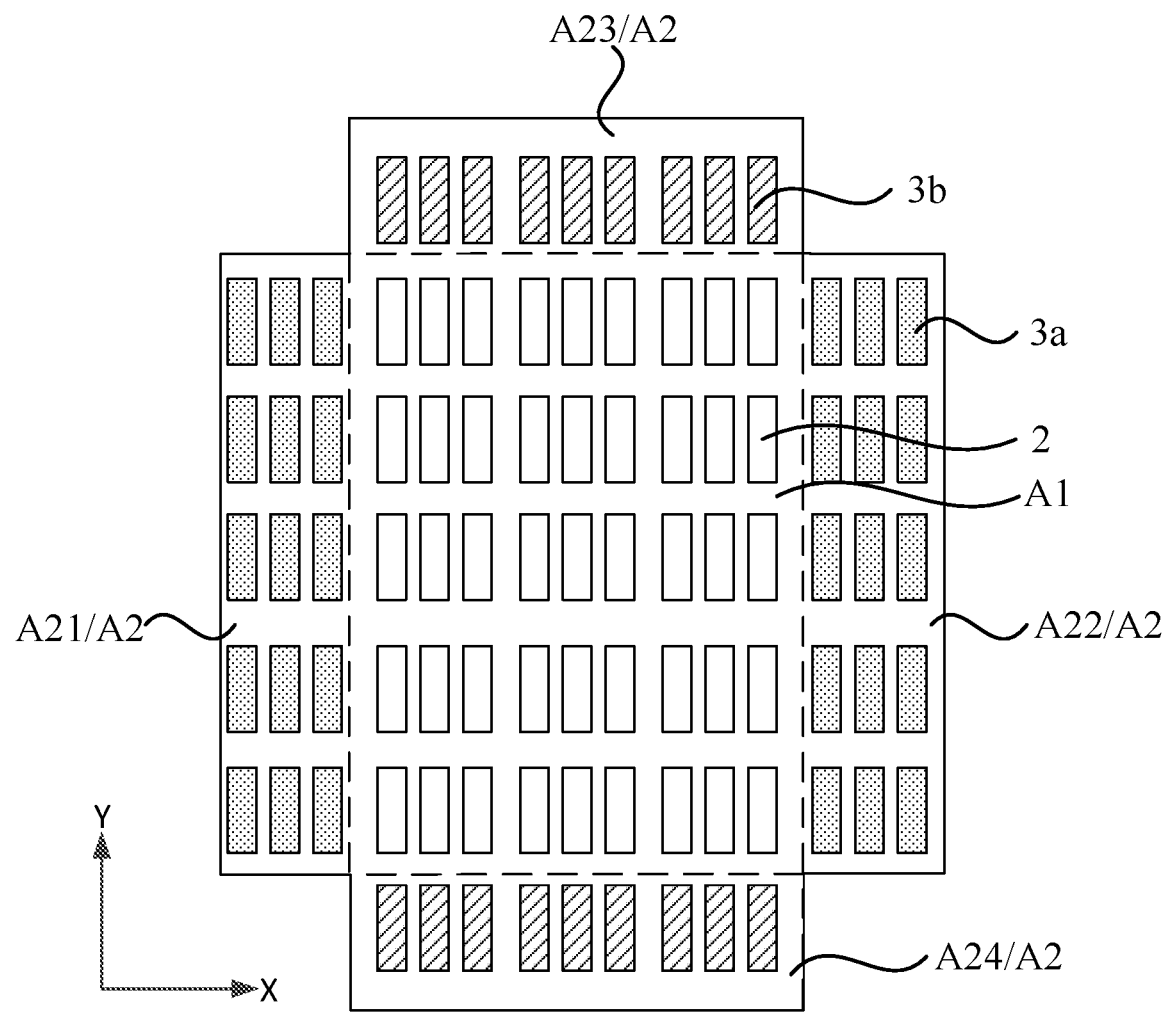
FIG. 10 is a schematic top view of the display panel of FIG. 9.
Figure 11:
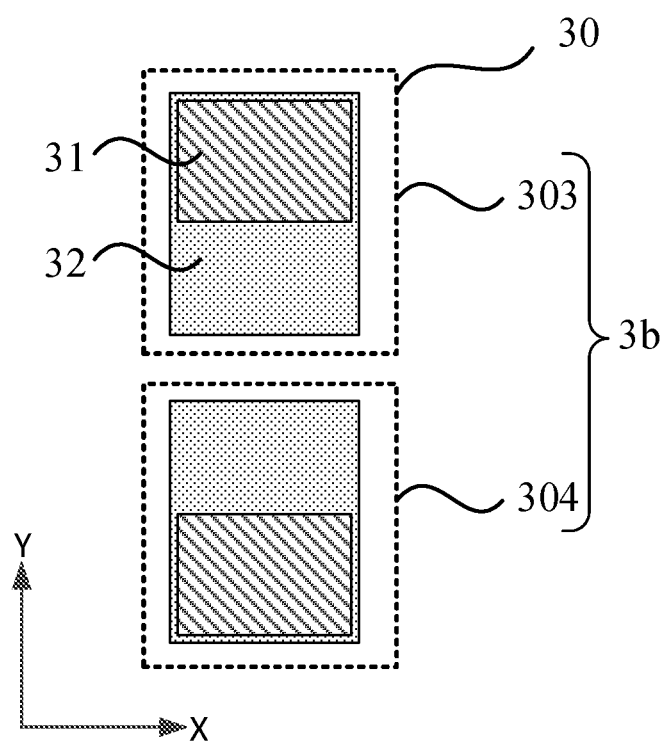
FIG. 11 is a schematic top view of a second deformation module provided by an embodiment of the present disclosure.

FIG. 9 is a schematic stereoscopic view of a display panel provided by another embodiment of the present disclosure, FIG. 10 is a schematic top view of the display panel shown in FIG. 9, FIG. 11 is a schematic top view of a second deformation module provided by an embodiment of the present disclosure, and with reference to FIGS. 9-11, the plurality of peripheral display regions A2 include a first peripheral display region A21, a second peripheral display region A22, a third peripheral display region A23, and a fourth peripheral display region A24. The first peripheral display region A21 and the second peripheral display region A22 are disposed opposite to each other in the first direction X, the third peripheral display region A23 and the fourth peripheral display region A24 are disposed opposite to each other in the second direction Y, and the first direction X and the second direction Y cross.

In an embodiment, the first direction X and the second direction Y may be perpendicular. In another embodiment, the first direction X and the second direction Y may form an acute angle or an obtuse angle. The deformation module 3 includes a first deformation module 3a and a second deformation module 3b. The first deformation module 3a includes a first deformation element 301 and a second deformation element 302. In a same first deformation module 3a, the first deformation element 301 and the second deformation element 302 are arranged in the first direction X. The first deformation module 3a is located in at least one of the first peripheral display region A21 and the second peripheral display region A22. The second deformation module 3b includes a third deformation element 303 and a fourth deformation element 304. In a same second deformation module 3b, the third deformation element 303 and the fourth deformation element 304 are arranged in the second direction Y. The second deformation module 3b is located in at least one of the third peripheral display region A23 and the fourth peripheral display region A24.

In the embodiments of the present disclosure, the display panel may be a quad-curved screen, with the first peripheral display region A21 and the second peripheral display region A22 respectively located on the left side surface and the right side surface of the display panel respectively, and the third peripheral display region A23 and the fourth peripheral display region A24 respectively located at the upper side surface and the lower side surface of the display panel. By disposing the first deformation module 3a in at least one of the first peripheral display region A21 and the second peripheral display region A22, and by disposing the second deformation module 3b in at least one of the third peripheral display region A23 and the fourth peripheral display region A24, the light-emitting element 2 can be made to tilt in the X-Z plane through the deformation of the first deformation element 301 and the deformation of the second deformation element 302 disposed in the first direction X, thus changing the light-emitting angle and the light-emitting direction of the light-emitting element 2 in the X-Z plane. Similarly, the light-emitting element 2 can be made to tilt in the Y-Z plane through the deformation of the third deformation element 303 and the deformation of the fourth deformation element 304 disposed in the second direction Y, to change the light-emitting angle and the light-emitting direction of the light-emitting element 2 in the Y-Z plane, to make the light transmission path incline upward, thus users can obtain a better view angle and the display effect can be improved.

In other embodiments, regardless the display panel is a double-curved screen or a quad-curved screen, the second deformation module 3b may be only disposed in at least one of a third peripheral display region A23 and a fourth peripheral display region A24.

In one embodiment, the second deformation module 3b includes a third deformation element 303 and a fourth deformation element 304. In a direction perpendicular to the plane where the substrate 1 is located, the second deformation module 3b and the light-emitting element 2 overlap in a one-to-one correspondence. Thus, the light-emitting angle of the light-emitting element 2 can be changed through the second deformation module 3b that overlaps the light-emitting element 2. In other embodiments, in the direction perpendicular to the plane where the substrate 1 is located, at least two second deformation modules 3b may overlap a same light-emitting element 2.

Figure 12:
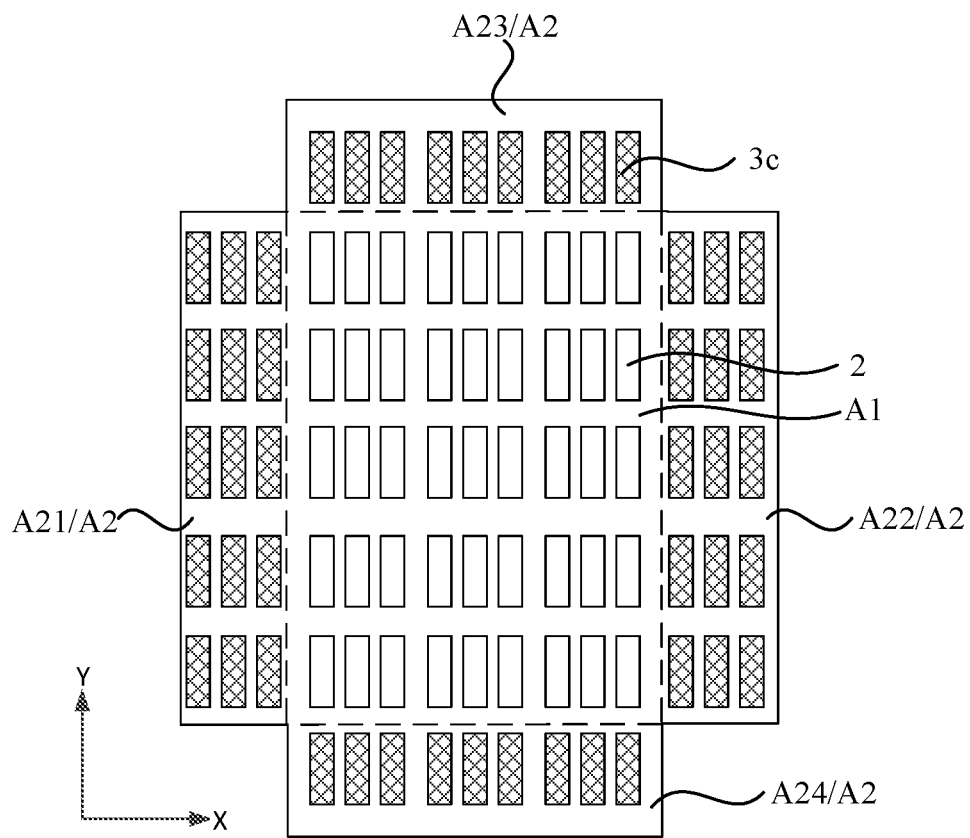
FIG. 12 is a schematic top view of a display panel provided by another embodiment of the present disclosure.
Figure 13:
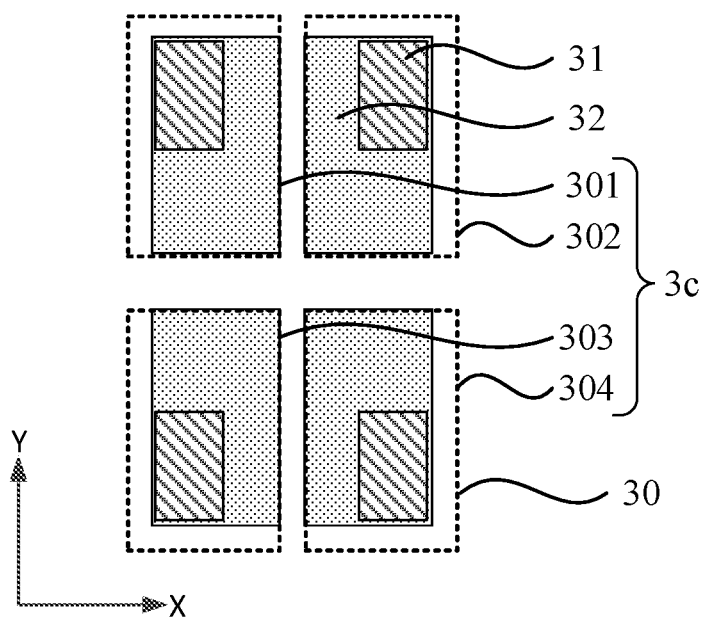
FIG. 13 is a schematic top view of a third deformation module provided by an embodiment of the present disclosure.

FIG. 12 is a schematic top view of a display panel provided by another embodiment of the present disclosure, FIG. 13 is a schematic top view of a third deformation module provided by an embodiment of the present disclosure, and with reference to FIG. 9, FIG. 12 and FIG. 13, the display panel includes a main display region A1 and peripheral display regions A2, the plurality of peripheral display region A2 are bent toward a side opposite to the main display region A1. The plurality of peripheral display regions A2 include a first peripheral display region A21 and a second peripheral display region A22 that are disposed opposite to each other in the first direction X, as well as a third peripheral display region A23 and a fourth peripheral display region A24 that are disposed opposite to each other in the second direction Y. The first direction X intersects the second direction Y. The plurality of deformation modules 3 include a third deformation module 3c, and the third deformation module 3c includes a first deformation element 301, a second deformation element 302, a third deformation element 303, and a fourth deformation element 304. In a same third deformation module 3c, the first deformation element 301 and the second deformation element 302 are arranged in the first direction X, the third deformation element 303 and the fourth deformation element 304 are arranged in the first direction X, the first deformation element 301 and the third deformation element 303 are arranged in the second direction Y, the second deformation element 302 and the fourth deformation element 304 are arranged in the second direction Y. The first deformation element 301, the second deformation element 302, the third deformation element 303, and the fourth deformation element 304 may form an array with two rows and two columns. The third deformation module 3c is located in at least one of the first peripheral display region A21, the second peripheral display region A22, the third peripheral display region A23, and the fourth peripheral display region A24. In the embodiments of the present disclosure, as that the third deformation module 3c includes a first deformation element 301, a second deformation element 302, a third deformation element 303, and a fourth deformation element 304, the light-emitting element 2 can be made to tilt in the X-Z plane, through the deformation of the first deformation element 301 and the deformation of the second deformation element 302 disposed in the first direction X, as well as through the deformation of the third deformation element 303 and the deformation of the fourth deformation element 304 disposed in the first direction X. Also, the light-emitting element 2 can be made to tilt in the Y-Z plane, through the deformation of the first deformation element 301 and the deformation of the third deformation element 303 disposed in the second direction Y, as well as through the deformation of the second deformation element 302 and the deformation of the fourth deformation element 304 disposed in the second direction Y. Therefore, the light transmission path can be made to incline upward, thus users can obtain a better view angle and the display effect can be improved. It should be noted that, in a case where the third deformation module 3c deforms, the light-emitting element 2 can be made not only to tilt in the X-Z plane, but also to tilt in the Y-Z plane, thus, the third deformation module 3c can be used in each peripheral display region A2 of the display panel to improve the display effect of the display panel, reducing types of the deformation modules 3, and reducing the manufacturing difficulty of the display panel.

In another embodiment, the display panel is a double-curved screen, and the display panel includes a first deformation module 3a and a third deformation module 3c. The first deformation module 3a is located in at least one of the first peripheral display region A21 and the second peripheral display region A22, and the third deformation module 3c is located in at least one of the first peripheral display region A21 and the second peripheral display region A22.

In another embodiment, the display panel is a quad-curved screen, and the display panel includes a first deformation module 3a and a third deformation module 3c. The first deformation module 3a is located in at least one of the first peripheral display region A21 and the second peripheral display region A22, the third deformation module 3c is located in at least one of the first peripheral display region A21, the second peripheral display region A22, the third peripheral display region A23, and the fourth peripheral display region A24.

In another embodiment, the display panel is a quad-curved screen, and the display panel includes a second deformation module 3b and a third deformation module 3c. The second deformation module 3b is located in at least one of the third peripheral display region A23 and the fourth peripheral display region A24, and the third deformation module 3c is located in at least one of the first peripheral display region A21, the second peripheral display region A22, the third peripheral display region A23, and the fourth peripheral display region A24.

In another embodiment, the display panel is a quad-curved screen, and the display panel includes a first deformation module 3a, a second deformation module 3b, and a third deformation module 3c. The first deformation module 3a is located in at least one of the first peripheral display region A21 and the second peripheral display region A22, the second deformation module 3b is located in at least one of the third peripheral display region A23 and the fourth peripheral display region A24, and the third deformation module 3c is located in at least one of the first peripheral display region A21, the second peripheral display region A22, the third peripheral display region A23, and the fourth peripheral display region A24.

In one embodiment, the third deformation module 3c includes a first deformation element 301 and a second deformation element 302, a third deformation element 303 and a fourth deformation element 304. In a direction perpendicular to the plane where the substrate 1 is located, the third deformation module 3c and the light-emitting element 2 overlap in a one-to-one correspondence. Thus, the light-emitting angle of the light-emitting element 2 can be changed by the third deformation module 3c that overlaps the light-emitting element 2. In other embodiments, in the direction perpendicular to the plane where the substrate 1 is located, at least two third deformation modules 3c may overlap a same light-emitting element 2.

In an embodiment, with reference to FIGS. 4 to 13, the deformation module 3 includes the plurality of deformation elements 30. In a same deformation module 3, deformation layers 32 of any two deformation elements 30 are separated from each other. In the embodiments of the present disclosure, the deformation layers 32 of the two deformation elements 30 are not in direct contact, instead, the deformation layers 32 of the two deformation elements 30 are separated by a distance, thus, a gap between the deformation layers 32 of the two deformation elements 30 provides sufficient deformation space for the deformation layer 32, which facilitates the deformation of the deformation element 30.

In one embodiment, with further reference to FIG. 8, in the first deformation module 3a, the deformation layer 32 of the first deformation element 301 and the deformation layer 32 of the second deformation element 302 are separated from each other. With further reference to FIG. 11, in the second deformation module 3b, the deformation layer 32 of the third deformation element 303 and the deformation layer 32 of the fourth deformation element 304 are separated from each other. With further reference to FIG. 13, in the third deformation module 3c, any two of the deformation layer 32 of the first deformation element 301, the deformation layer 32 of the second deformation element 302, the deformation layer 32 of the third deformation element 303, and the deformation layer 32 of the fourth deformation element 304 are separated from each other.

In one embodiment, with reference to FIGS. 4 to 13, the deformation module 3 includes deformation elements 30. In a same deformation module 3, deformation cathodes 33 of any two deformation elements 30 are separated from each other.

Figure 14:
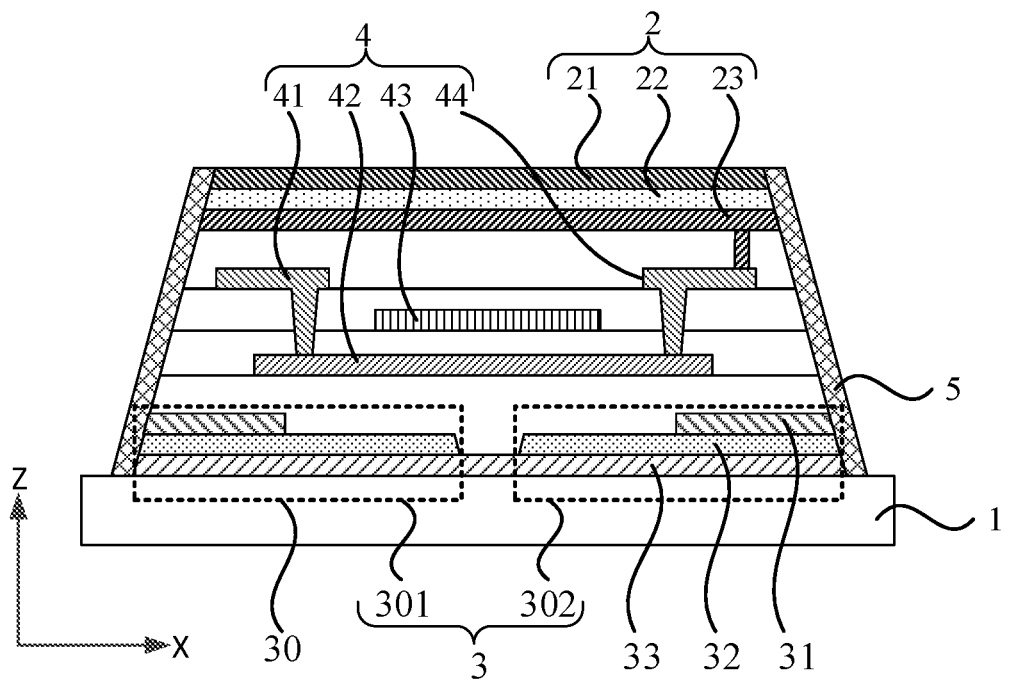
FIG. 14 is a schematic cross-sectional view of a display panel provided by another embodiment of the present disclosure.

FIG. 14 is a schematic cross-sectional view of a display panel provided by another embodiment of the present disclosure. With reference to FIG. 14, the deformation module 3 includes deformation elements 30. In the same deformation module 3, the deformation cathodes 33 of all the deformation elements 30 are electrically connected. In the embodiments of the present disclosure, by that all the deformation elements 30 in the same deformation module 3 share a same deformation cathode 33, and by that the deformation layers 32 of the plurality of deformation elements 30 are discretely disposed on a same deformation cathode 33, only one wire is needed to be provided to connect to the deformation cathodes 33 of all the deforming elements 30 in the same deformation module 3, reducing a number of wires.

Figure 15:
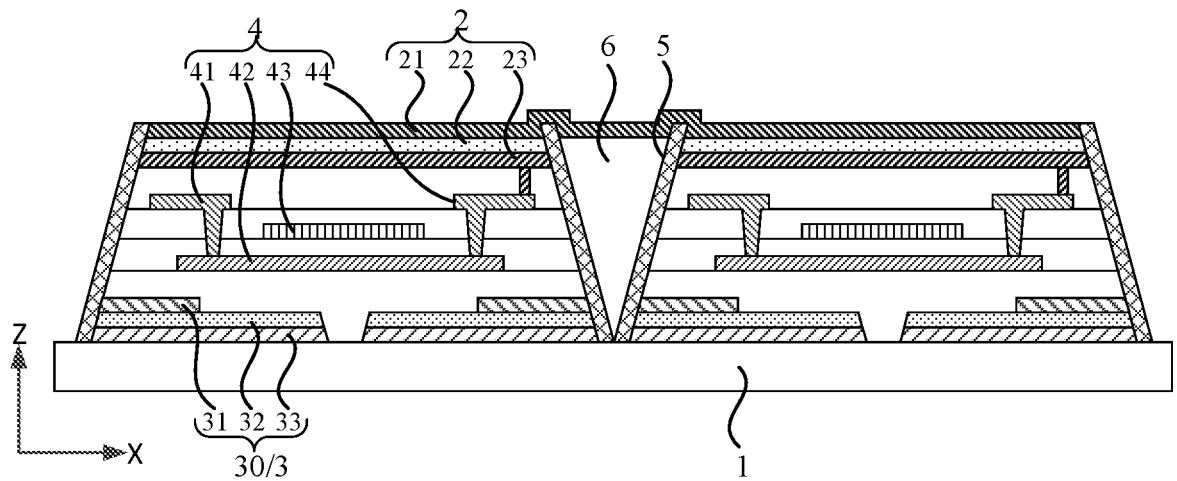
FIG. 15 is a schematic cross-sectional view of a display panel provided by another embodiment of the present disclosure.

FIG. 15 is a schematic cross-sectional view of a display panel provided by another embodiment of the present disclosure. With reference to FIG. 15, the display panel further includes a filling layer 6. The filling layer 6 and the deformation module 3 are located on a same side of the substrate 1, and the filling layer 6 is located between two adjacent deformation modules 3. In a case where the deformation module 3 deforms, the light-emitting element 2 and the deformation module 3 tilt to press the filling layer 6. Thus, in an embodiment, the filling layer 6 is made of a flexible material that is easy to deform, such as foam or polyimide.

In one embodiment, with reference to FIG. 15, the isolation layer 5 on the sidewalls of two adjacent trapezoidal structures forms a V-shaped groove, and the filling layer 6 is filled in the V-shaped groove.

In one embodiment, with reference to FIG. 15, the display cathodes 21 of all the light-emitting elements 2 are electrically connected. That is, all the light-emitting elements 2 share a same display cathode 21. The filling layer 6 is located between the substrate 1 and the display cathode 21, and provides a flat surface for the display cathode 21 after the filling layer 6 fills the V-shaped groove, which facilitates to form an entire surface of display cathode 21 by evaporation and other methods, and facilitates to prevent the display cathode 21 from fracture or disconnection due to a large drop. In other embodiments, the display cathodes 21 of any two light-emitting elements 2 may also be separated from each other, that is, each light-emitting element 2 is provided with an independent display cathode 21, and two light-emitting elements 2 are respectively provided with two independent display cathodes 21, which is not limited in the present disclosure.

Figure 16:
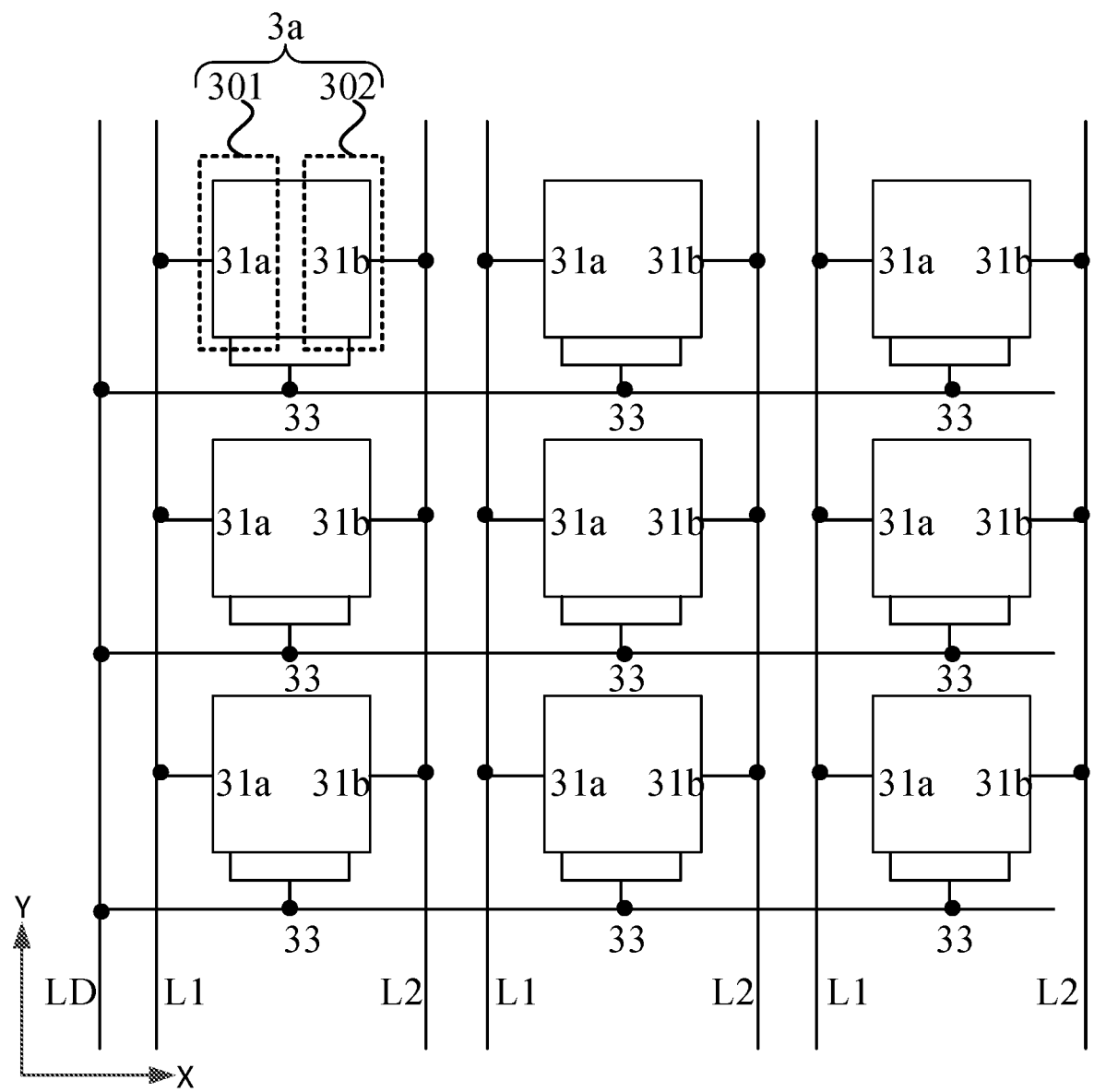
FIG. 16 is a schematic view of circuit connections of first deformation modules provided by an embodiment of the present disclosure.

FIG. 16 is a schematic view of circuit connections of first deformation modules provided by an embodiment of the present disclosure. With reference to FIG. 7, FIG. 8, and FIG. 16, in the second direction Y, the deformation anodes 31 of the plurality of first deformation elements 301 are electrically connected, the deformation anodes 31 of the plurality of second deformation elements 302 are electrically connected, and the first direction X and the second direction Y intersect. In the embodiments of the present disclosure, in the second direction Y, the deformation anodes 31 of the first deformation elements 301 in the plurality of first deformation modules 3a are electrically connected, the deformation anodes 31 of the second deformation elements 302 in the plurality of first deformation modules 3a are electrically connected, so that a same driving signal can be provided for the deformation anodes 31 of the first deformation elements 301 in a column of first deformation modules 3a, as well as that a same driving signal can be provided for the deformation anodes 31 of the second deformation elements 302 in a column of the first deformation modules 3a. Thus, the first deformation elements 301 and the second deformation elements 302 in a column of first deformation modules 3a may have a same deformation amount at a same time. Furthermore, a column of first deformation modules 3a can make the column of light-emitting elements 2 to tilt at a same angle at the same time, and the display effect of the display panel can be improved.

In one embodiment, with reference to FIG. 16, in the first deformation module 3a, the deformation anode 31 of the first deformation element 301 is denoted as the deformation anode 31a, and the deformation anode 31 of the second deformation element 302 is denoted as the deformation anode 31b. In the second direction Y, the plurality of deformation anodes 31a are electrically connected to a same wire L1, and the plurality of deformation anodes 31b are electrically connected to a same wire L2.

Figure 17:
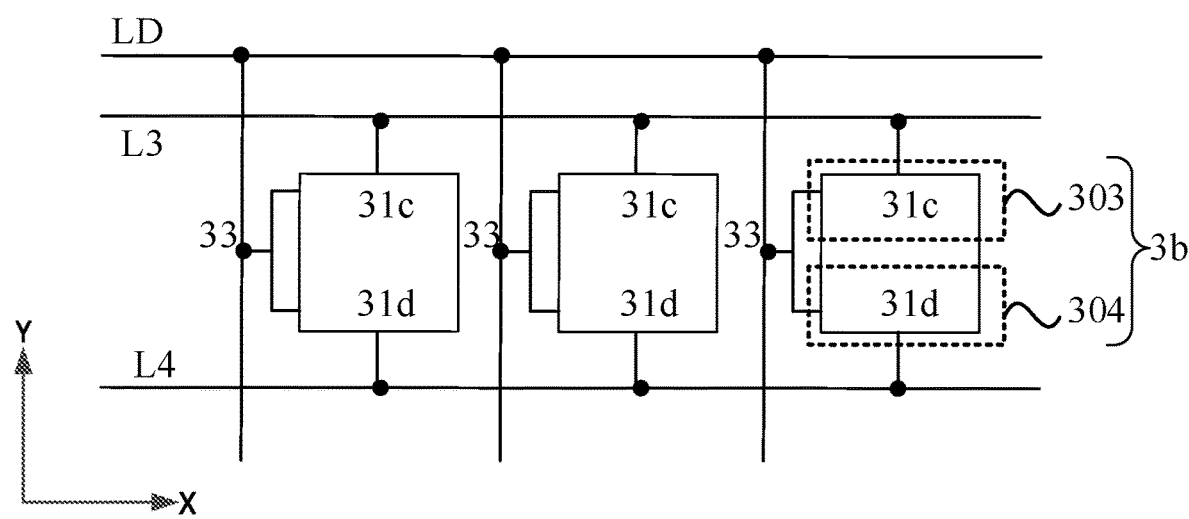
FIG. 17 is a schematic view of circuit connections of second deformation modules provided by an embodiment of the present disclosure.

FIG. 17 is a schematic view of circuit connections of second deformation modules provided by an embodiment of the present disclosure. With reference to FIG. 10, FIG. 11, and FIG. 17, in the first direction X, the deformation anodes 31 of the plurality of third deformation elements 303 are electrically connected, and the deformation anodes 31 of the plurality of fourth deformation elements 304 are electrically connected.

In the embodiments of the present disclosure, in the first direction X, the deformation anodes 31 of the third deformation elements 303 in the plurality of second deformation modules 3b are electrically connected, the deformation anodes 31 of the fourth deformation elements 304 in the plurality of second deformation modules 3b are electrically connected, so that a same driving signal is provided for the deformation anodes 31 of the third deformation elements 303 in a row of second deformation modules 3b, as well as a same driving signal is provided for the deformation anodes 31 of the fourth deformation elements 304 in a row of the second deformation modules 3b. Therefore, the third deformation elements 303 in a row of first deformation modules 3b and the fourth deformation elements 304 in a row of first deformation modules 3b may have a same deformation amount at the same time. Furthermore, a row of second deformation modules 3b can make the row of light-emitting elements 2 to tilt at a same angle at the same time, and the display effect of the display panel can be improved.

In one embodiment, with reference to FIG. 17, in the second deformation module 3b, the deformation anode 31 of the third deformation element 303 is denoted as the deformation anode 31c, the deformation anode 31 of the fourth deformation element 304 is denoted as the deformation anode 31d. In the first direction X, the plurality of deformation anodes 31c are electrically connected to a same wire L3, and the plurality of deformation anodes 31d are electrically connected to a same wire L4.

Figure 18:
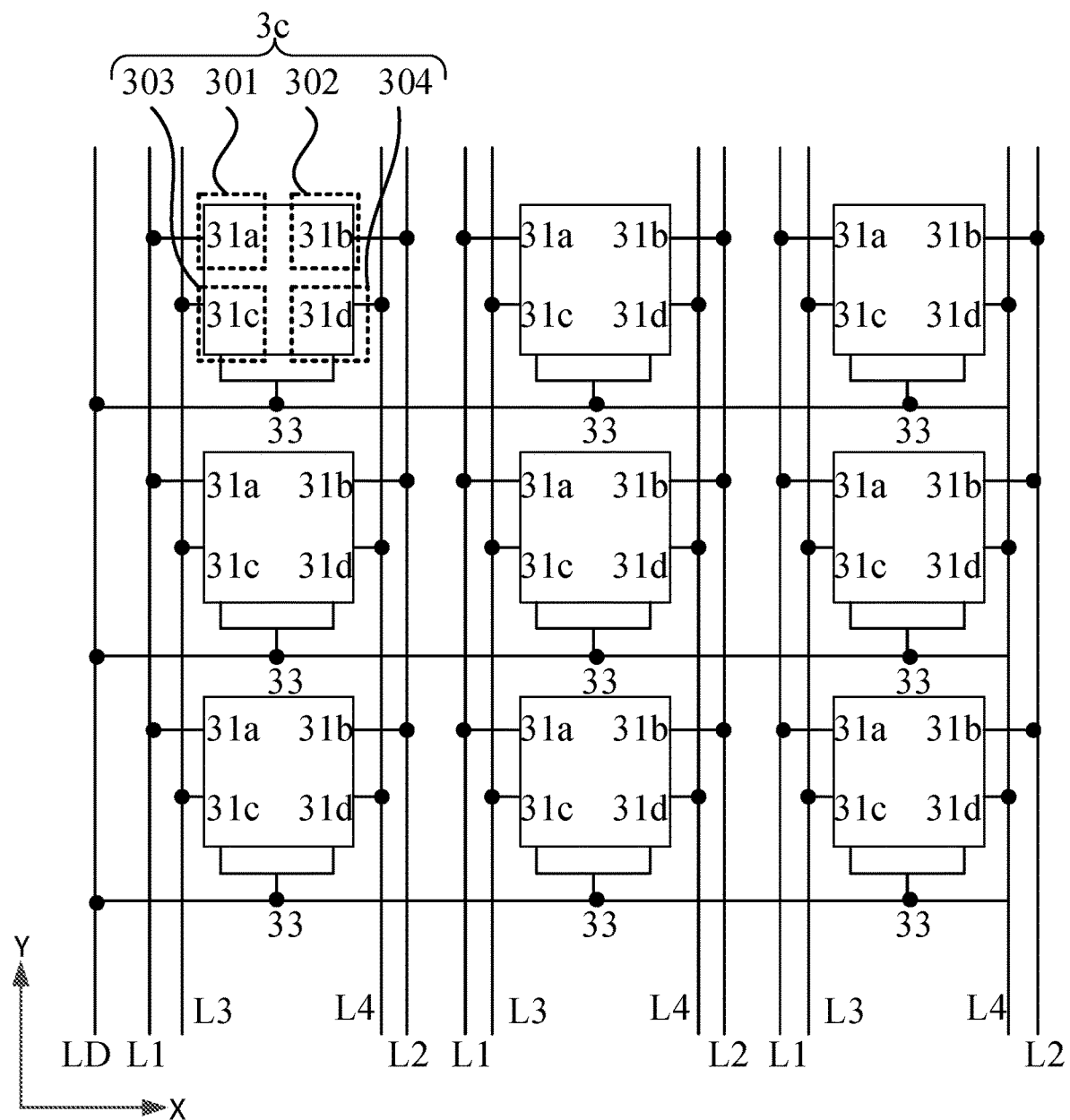
FIG. 18 is a schematic view of circuit connections of third deformation modules provided by an embodiment of the present disclosure.

FIG. 18 is a schematic view of circuit connections of third deformation modules provided by an embodiment of the present disclosure. With reference to FIG. 12, FIG. 13 and FIG. 18, in the second direction Y, the deformation anodes 31 of the plurality of first deformation elements 301 are electrically connected, and the deformation anodes 31 of the plurality of second deformation elements 302 are electrically connected, the deformation anodes 31 of the plurality of third deformation elements 303 are electrically connected, and the deformation anodes 31 of the plurality of fourth deformation elements 304 are electrically connected.

In the embodiments of the present disclosure, in the second direction Y, the deformation anodes 31 of the first deformation elements 301 in the plurality of third deformation modules 3c are electrically connected, the deformation anodes 31 of the second deformation elements 302 in the plurality of third deformation modules 3c are electrically connected, the deformation anodes 31 of the third deformation elements 303 in the plurality of third deformation modules 3c are electrically connected, and the deformation anodes 31 of the fourth deformation elements 304 in the plurality of third deformation modules 3c are electrically connected, so that a same driving signal is provided for the deformation anodes 31 of the first deformation elements 301 in a column of third deformation modules 3c, a same driving signal is provided for the deformation anodes 31 of the second deformation elements 302 in a column of third deformation modules 3c, a same driving signal is provided for the deformation anodes 31 of the third deformation elements 303 in a column of third deformation modules 3c, and a same driving signal is provided for the deformation anodes 31 of the fourth deformation elements 304 in a column of third deformation modules 3c. Therefore, a column of third deformation modules 3c can have a same deformation amount at the same time, and the column of third deformation modules 3c can make the column of light-emitting elements 2 to tilt at a same angle at the same time, and the display effect of the display panel can be improved.

In one embodiment, with reference to FIG. 18, in the third deformation module 3c, the deformation anode 31 of the first deformation element 301 is denoted as the deformation anode 31a, and the deformation anode 31 of the second deformation element 302 is denoted as the deformation anode 31b, the deformation anode 31 of the third deformation element 303 is denoted as the deformation anode 31c, and the deformation anode 31 of the fourth deformation element 304 is denoted as the deformation anode 31d. In the second direction Y, the plurality of deformation anodes 31a are electrically connected to a same wire L1, the plurality of deformation anodes 31b are electrically connected to a same wire L2, the plurality of deformation anodes 31c are electrically connected to a same wire L3, and the plurality of deformation anodes 31d are electrically connected to a same wire L4.

In other embodiments, in the first direction X, the deformation anodes 31 of the first deformation elements 301 in the plurality of third deformation modules 3c are electrically connected, the deformation anodes 31 of the second deformation elements 302 in the plurality of third deformation modules 3c are electrically connected, the deformation anodes 31 of the third deformation elements 303 in the plurality of third deformation modules 3c are electrically connected, and the deformation anodes 31 of the fourth deformation elements 304 in the plurality of third deformation modules 3c are electrically connected.

In an embodiment, with reference to FIGS. 16-18, the deformation cathodes 33 of all the deformation elements 30 are electrically connected to each other. That is, the deformation cathode 33 in each deformation module 3 is electrically connected to a same wire LD. In the embodiments of the present disclosure, as the deformation cathode 33 in each deformation module 3 is electrically connected to the same wire LD, a number of wires electrically connected to the deformation cathodes 33 is reduced.

In one embodiment, with reference to FIGS. 1 to 18, the driving signal applied to the deformation anode 31 and the driving signal applied to the deformation cathode 33 are direct current (DC) signals. In the embodiments of the present disclosure, as the driving signals applied to the deformation anode 31 and the deformation cathode 33 are DC signals, compared to alternating current (AC) signals, DC signals have smaller influence on the gate 43 and the semiconductor layer 42 of the thin film transistor, which would not have adverse impact on the light-emitting display of the display panel.

With further reference to FIGS. 1 to 15, the light-emitting element 2 includes a display cathode 21, a light-emitting layer 22 and a display anode 23, and the light-emitting layer 22 is located between the display cathode 21 and the display anode 23. The display anode 23 is electrically connected to the drain 44 of the thin film transistor. In the embodiments of the present disclosure, the light-emitting layer 22 is driven to emit light by the display cathode 21 and the display anode 23.

In an embodiment, the light emitting layer 22 may include an organic light-emitting material layer, and at least one of a hole injection layer, a hole transport layer, an electron blocking layer, a hole blocking layer, an electron transport layer, and an electron injection layer. In a case where the light is generated in the organic light-emitting material layer, the generation process is as follows: under the action of an external electric field, electrons and holes are injected into the organic light-emitting material layer from the display cathodes 21 and the display anodes 23 respectively, which are recombined to generate excitons; the excitons migrate under the action of the external electric field, and transfer energy to light-emitting molecules in the organic light-emitting material layer, to excite the electrons to transfer from the ground state to the excited state; and energy in the excited state releases by means of radiation transition, generating light. The hole injection layer, the hole transport layer, the electron blocking layer, the hole blocking layer, the electron transport layer and the electron injection layer are auxiliary film layers, to improve light generation efficiency in the light-emitting functional layer. The display panel may be an organic light-emitting display panel.

In another embodiment, the light-emitting layer 22 may include an inorganic light-emitting material layer. The light-emitting element 2 is an inorganic light-emitting diode, and the display panel is a micro-LED display panel (i.e., a micro light-emitting diodes display panel).

Figure 19:
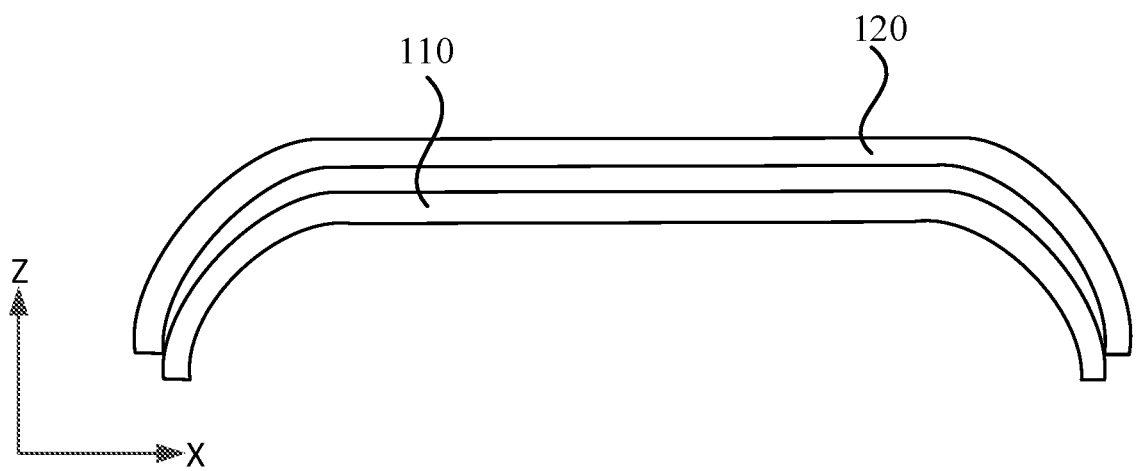
FIG. 19 is a schematic view of a display device provided by an embodiment of the present disclosure.

The embodiment of the present disclosure also provides a display device. FIG. 19 is a schematic view of a display device provided by an embodiment of the present disclosure. With reference to FIG. 19, the display device includes any display panel 110 provided by embodiments of the present disclosure. The display device may in an embodiment be a mobile phone, a tablet computer, a vehicle-mounted display device, a smart wearable device, and etc.

In one embodiment, with reference to FIG. 19, the display device may further include a cover plate 120 located on a light-emitting display side of the display panel 110. The display panel 110 is conformal to the cover plate 120, that is, a shape of the display panel 110 is similar to that of the cover plate 120. In a position where the cover plate 120 is flat, the display panel 110 is flat, and in a position where the cover plate 120 is bent, the display panel 110 is bent.

What is claimed is:

1. A display panel, comprising:
    a substrate;
    a light-emitting element located on a side of the substrate; and
    a deformation module located between the substrate and the light-emitting element; wherein the deformation module comprises at least one deformation element, and in a direction perpendicular to a plane where the substrate is located, the at least one deformation element in the deformation module overlaps the light-emitting element;
    wherein each deformation element of the at least one deformation element comprises a deformation anode, a deformation layer and a deformation cathode, the deformation layer is located between the deformation anode and the deformation cathode; and the deformation layer is configured to exhibit different deformation magnitudes according to changes of electric field intensity between the deformation anode and the deformation cathode, controlling the light-emitting angle of the light-emitting element; and
    wherein a cross section of the light-emitting element and the deformation module as a whole, perpendicular to the plane where the substrate is located, is in a trapezoidal structure; and
    the display panel further comprises an isolation layer, wherein the isolation layer is located on a sidewall of the trapezoidal structure.

2. The display panel of claim 1, further comprising a pixel driving circuit, wherein the pixel driving circuit is located between the at least one deformation element and the light-emitting element, and is electrically connected to the light-emitting element.

3. The display panel of claim 1, further comprising a pixel driving circuit, the pixel driving circuit is located between the substrate and the at least one deformation element and is electrically connected to the light-emitting element.

4. The display panel of claim 1, wherein an area of a surface of a side of the deformation layer farther away from the substrate is smaller than an area of a surface of a side of the deformation layer closer to the substrate.

5. The display panel of claim 1, wherein the deformation layer comprises a first region and a second region, the second region is located on a side of the first region closer to a center of the light-emitting element, and the deformation anode is located in the first region.

6. The display panel of claim 1, wherein the deformation layer comprises a first region and a second region, the second region is located on a side of the first region closer to a center of the light-emitting element, the deformation anode comprises a first deformation anode and a second deformation anode that are electrically insulated from each other, the first deformation anode is located in the first region, and the second deformation anode is located in the second region.

7. The display panel of claim 1, wherein
    the deformation module comprises a plurality of deformation elements; and
    deformation layers of any two deformation elements in a same deformation module are separated from each other.

8. The display panel of claim 1, wherein the light-emitting element comprises a display cathode, a light-emitting layer, and a display anode, and the light-emitting layer is located between the display cathode and the display anode.

9. The display panel of claim 1 comprises a main display region and a plurality of peripheral display regions,
    wherein the plurality of peripheral display regions are bent toward a side opposite to the main display region; and the plurality of peripheral display regions comprise a first peripheral display region, a second peripheral display region, a third peripheral display region and a fourth peripheral display region, and wherein the first peripheral display region and the second peripheral display region are disposed opposite to each other in a first direction, the third peripheral display region and the fourth peripheral display region are disposed opposite to each other in a second direction, and the first direction and the second direction intersect;
    wherein a plurality of deformation modules comprise a third deformation module, and wherein the third deformation module comprises a first deformation element, a second deformation element, a third deformation element, and a fourth deformation element, the first deformation element and the second deformation element in a same third deformation module are arranged in the first direction, the third deformation element and the fourth deformation element in a same third deformation module are arranged in the first direction, the first deformation element and the third deformation element in a same third deformation module are arranged in the second direction, and the second deformation element and the fourth deformation element in a same third deformation module are arranged in the second direction; and
    wherein the third deformation module is located in at least one of the first peripheral display region, the second peripheral display region, the third peripheral display region, and the fourth peripheral display region.

10. The display panel of claim 9, wherein, deformation anodes of a plurality of first deformation elements are electrically connected in the first direction or the second direction, deformation anodes of the plurality of second deformation elements are electrically connected in the first direction or the second direction, deformation anodes of a plurality of third deformation elements are electrically connected in the first direction or the second direction, and deformation anodes of a plurality of fourth deformation elements are electrically connected in the first direction or the second direction.

11. The display panel of claim 1, wherein
    the deformation module comprises a plurality of deformation elements; and
    deformation cathodes of all the plurality of deformation elements in a same deformation module are electrically connected.

12. The display panel of claim 11, wherein deformation cathodes of all deformation elements are electrically connected to each other.

13. A display panel, comprising:
a substrate;
a light-emitting element located on a side of the substrate; and
a deformation module located between the substrate and the light-emitting element; wherein the deformation module comprises at least one deformation element, and in a direction perpendicular to a plane where the substrate is located, the at least one deformation element in the deformation module overlaps the light-emitting element;
wherein each deformation element of the at least one deformation element comprises a deformation anode, a deformation layer and a deformation cathode, the deformation layer is located between the deformation anode and the deformation cathode; and the deformation layer is configured to exhibit different deformation magnitudes according to changes of electric field intensity between the deformation anode and the deformation cathode, controlling the light-emitting angle of the light-emitting element;
wherein the display panel further comprises a main display region and a plurality of peripheral display regions, wherein the plurality of peripheral display regions are bent toward a side opposite to the main display region; the plurality of peripheral display regions comprise a first peripheral display region and a second peripheral display region that are disposed opposite to each other in a first direction;
wherein the deformation module comprises a first deformation module, and the first deformation module comprises a first deformation element and a second deformation element; and the first deformation element and the second deformation element in a same first deformation module are arranged in the first direction; and
wherein the first deformation module is located in at least one of the first peripheral display region and the second peripheral display region.

14. The display panel of claim 13, wherein,
deformation anodes of a plurality of first deformation elements are electrically connected in the second direction, deformation anodes of a plurality of second deformation elements are electrically connected in the second direction, and the first direction and the second direction intersect.

15. The display panel of claim 13, wherein the plurality of peripheral display regions further comprise a third peripheral display region and a fourth peripheral display region that are disposed opposite to each other in a second direction, and the first direction and the second direction intersect;
wherein the deformation module further comprises a second deformation module, the second deformation module comprises a third deformation element and a fourth deformation element; and the third deformation element and the fourth deformation element, in a same second deformation module, are arranged in the second direction; and
wherein the second deformation module is located in at least one of the third peripheral display region and the fourth peripheral display region.

16. The display panel of claim 15, wherein deformation anodes of a plurality of third deformation elements are electrically connected in the first direction, and deformation anodes of a plurality of fourth deformation elements are electrically connected in the first direction.

17. A display device, comprising a display panel, wherein the display panel comprises:
a substrate;
a light-emitting element located on a side of the substrate; and
a deformation module located between the substrate and the light-emitting element; wherein the deformation module comprises at least one deformation element, and in a direction perpendicular to a plane where the substrate is located, the at least one deformation element in the deformation module overlaps the light-emitting element;
wherein each deformation element of the at least one deformation element comprises a deformation anode, a deformation layer and a deformation cathode, the deformation layer is located between the deformation anode and the deformation cathode; and the deformation layer is configured to exhibit different deformation magnitudes according to changes of electric field intensity between the deformation anode and the deformation cathode, controlling the light-emitting angle of the light-emitting element;
wherein a cross section of the light-emitting element and the deformation module as a whole, perpendicular to the plane where the substrate is located, is in a trapezoidal structure; and
the display panel further comprises an isolation layer, wherein the isolation layer is located on a sidewall of the trapezoidal structure.

* * * * *